(12) United States Patent
Lee et al.

(10) Patent No.: US 6,630,684 B2
(45) Date of Patent: Oct. 7, 2003

(54) PHOTONIC CRYSTAL ORGANIC LIGHT EMITTING DEVICE HAVING HIGH EXTRACTION EFFICIENCY

(75) Inventors: Yong-Hee Lee, Taejon (KR); Yong-jae Lee, Taejon (KR)

(73) Assignee: Korea Advanced Institute of Science of Technology, Taejon-si (KR)

( * ) Notice: Subject to any disclaimer, the term of this patent is extended or adjusted under 35 U.S.C. 154(b) by 0 days.

(21) Appl. No.: 10/055,945

(22) Filed: Jan. 28, 2002

(65) Prior Publication Data

US 2003/0057417 A1 Mar. 27, 2003

(30) Foreign Application Priority Data

Sep. 25, 2001 (KR) ........................................ 2001-59278

(51) Int. Cl.[7] ................................................. S01L 51/00
(52) U.S. Cl. ............................. 257/40; 257/98; 313/504
(58) Field of Search ........................... 257/40, 98, 103; 313/504

(56) References Cited

U.S. PATENT DOCUMENTS

| | | |
|---|---|---|
| 5,530,269 A | 6/1996 | Tang |
| 6,060,728 A | 5/2000 | Ghosh et al. |
| 6,423,980 B1 * | 7/2002 | Wilson et al. .................. 257/21 |
| 6,476,550 B1 * | 11/2002 | Oda et al. ..................... 313/504 |
| 6,490,089 B1 * | 12/2002 | Fabiny ......................... 359/571 |

* cited by examiner

*Primary Examiner*—Sara Crane
(74) *Attorney, Agent, or Firm*—Bachman & LaPointe, P.C.

(57) ABSTRACT

Disclosed is a photonic crystal organic light emitting device. The device comprises a transparent substrate having a concavo-convex structure in an upper surface thereof, a transparent electrode layer formed on the transparent substrate, a hole conduction layer comprised of an organic EL material and formed on the transparent electrode layer, an electron conduction layer comprised of an organic EL material and formed on the hole conduction layer, and a cathode layer formed on the electron conduction layer. Here, a photonic crystal period due to the concavo-convex structure formed in the upper surface of the transparent substrate corresponds to a wavelength level of light generated at an interface between the electron conduction layer and the hole conduction layer. Therefore, a light extraction efficiency and a viewing angle are increased without degeneration of the image quality. Further, since the photonic crystal has an effective refractive value ranged between that of the transparent substrate and that of the transparent electrode layer, it has the same effect as in nonreflective coating, thereby simultaneously increasing the transmittance.

12 Claims, 5 Drawing Sheets

(a)

(b)

(c)

(d)

(a)

(b)

PHOTONIC CRYSTAL ORGANIC LIGHT EMITTING DEVICE HAVING HIGH EXTRACTION EFFICIENCY

BACKGROUND OF THE INVENTION

1. Field of the Invention

The present invention relates to an organic light emitting device, and more particularly, to an organic light emitting device in which a photonic crystal concavo-convex structure is formed in a transparent substrate and an transparent electrode layer to increase a light extraction efficiency.

2. Description of the Related Art

Recently, display devices based on organic light emitting materials become the center of attraction due to flatness, high definition, portability, low power consumption and so forth.

FIG. 1 is a schematic view of a conventional organic light emitting device. Referring to FIG. 1, the conventional organic light emitting device has a structure in which a transparent electrode layer 20, a hole conduction layer 30, an electron conduction layer 40 and a cathode layer 50 are sequentially stacked on a transparent substrate 10.

Herein, a glass substrate is typically used as the transparent substrate 10. An ITO (Indium-Tin-Oxide) layer is mainly used as the transparent electrode layer 20. In addition, an Mg—Al alloy layer may be used as the cathode electrode layer 50. The hole conduction layer 30 and the electron conduction layer 40 are comprised of an organic EL(electroluminescent) material. Typically, the hole conduction layer 30 is comprised of N,N'-diphenyl-N,N'-bis-(3-methylphenyl)-4,4'-diamine (hereinafter, "TPD") or polyethylenedeoxythiophene (PEDOT), and the electron conduction layer 30 is widely comprised of tris (8-hydroxyquinolino) aluminum (hereinafter, "Alq3"). The typical material of each layer has an absolute refractive index, i.e., n(glass)=1.46, n(ITO)=1.8, n(TPD)=1.76 and n(Alq3)=1.7.

As shown in FIG. 1, when a negative voltage is applied to the cathode electrode layer 50 and a positive voltage is applied to the transparent electrode layer 20, the combination of a hole and an electron is occurred in a junction portion (35: hereinafter, "active area") of the hole conduction layer 30 and the electron conduction layer 40. Thus, light is spontaneously radiated.

The light generated at the active area 35 is radiated through in turn an interface of the hole conduction layer 30 and the transparent electrode layer 20 and an interface of the transparent electrode layer 20 and the transparent substrate 10 to air. Since the absolute refractive index (n(ITO)=1.8) of the transparent electrode layer 20 is larger than that (n(Alq3)=1.7) of the electron conduction layer 40, at the interface of the electron conduction layer 40 and the transparent electrode layer 20, most of the light is refracted toward the transparent electrode layer 20 and then transmitted through the transparent electrode layer 20.

However, since the absolute refractive index (n(glass)=1.8) of the transparent electrode layer 20 is larger than the refractive index of substrate layer 10 (n(glass)=1.46), the light, at an angle larger than a critical angle, is totally reflected so as to be not transmitted to the glass. Further, since the absolute refractive index of the transparent substrate 10 is 1.46 and the absolute refractive index of the air is 1, the same phenomenon occurrs at the interface of the transparent substrate 10 and the air.

In the drawing, a reference symbol θcc designates a critical angle between the transparent electrode layer 20 and the transparent substrate 10, and a reference symbol θc is a critical angle between the transparent substrate 10 and the air, and θo is an incident angle of the light which is incident to the transparent substrate 10 to be converted into the angle of θc.

Assuming that the distribution of light generated from a specific radiation point of the active area 35 is spacially isotropic and the light is not reabsorbed, the amount of light, that is totally reflected from the transparent substrate, can be calculated by a following equation:

$$\int_{\theta_o}^{\theta_{cc}} T_{glass}(\theta)\sin\theta \, d\theta.$$

It is about 31.5%, wherein $T_{glss}(\theta)$ is a transmittance of the transparent substrate 10. And, in the same condition, the amount of light, that is totally reflected from the transparent electrode layer 20, can be calculated by a following equation:

$$\int_{\theta_{cc}}^{90} T_{ITO}(\theta)\sin\theta \, d\theta.$$

It is about 51%, wherein $T_{ITO}(\theta)$ is a transmittance of the transparent electrode layer 20. To summarize, the total-reflected light amount is about 80%.

Therefore, in conventional organic light emitting devices, the light extraction efficiency is only about 20%. There is a big room for improvement. Because of the low light extraction efficiency, the power dissipation should be large, and the life time of the arrayed light emitting device is reduced. Therefore, one need to make the light extraction efficiency as large as possible.

In order to increase the light extraction efficiency, several schemes have been proposed. For example, a cone-shaped array is formed on a glass substrate, such that the light, entering at larger angles than the critical angle, can be transmitted to an outside (cf. High external quantum efficiency organic light emitting device, G. Gu, D. Z. Garbuzov, P. E. Burrows, S. Venkatesh, S. R. Forrest, Optics Letters, 22, 396, 1997). Or a laminated lens array is formed on a glass substrate to reduce the incident angle, thereby increasing the light extraction efficiency (cf. Improvement of output coupling efficiency of organic light emitting diodes by backside substrate modification, C. F. Madigan, M. H. Lu, J. C. Sturm, Applied Physics Letters, 27, 1650, 2000). In these methods, however, there are some problems related to fabricating methods and the image quality is poor.

SUMMARY OF THE INVENTION

Therefore, the object of the present invention is to provide an organic light emitting device in which a photonic crystal concavo-convex structure is formed in the transparent substrate 10 and the transparent electrode layer 20, thereby increasing the light extraction efficiency.

To achieve the aforementioned object of the present invention, the photonic crystal organic light emitting device includes a transparent substrate having a concavo-convex structure in an upper surface thereof, a transparent electrode layer formed on the transparent substrate, a hole conduction layer comprised of an organic EL material and formed on the transparent electrode layer, an electron conduction layer comprised of an organic EL material and formed on the hole conduction layer, and a cathode layer formed on the electron conduction layer.

Preferably, the lattice constant of the concavo-convex structure formed in the upper surface of the transparent substrate ranges from ⅓λ to 2λ, where λ is the wavelength of light in the active area. And transparent electrode layer has a thickness of 30–200 nm. Further, the depth of a concave potion is formed as deep as possible within the extent that the electrical properties of the transparent electrode layer are acceptable.

The photonic crystal of the concavo-convex structure formed in the upper surface of the transparent substrate can be periodically and repeatedly arrayed in a square lattice type, a triangular lattice type or a honeycomb lattice type. The concavo-convex structure can be formed by etching the upper surface of the transparent substrate. However, it is clear that other methods such as a wet etching or a micro-imprinting also can be used.

If one wants to obtain the constant diffraction angle irrespective of the color of light generated at the interface between the electron conduction layer and the hole conduction layer, it is better to have a constant value λ/Δ, wherein Δ is a period of the photonic period due to the concavo-convex structure formed in the transparent substrate, and λ is a wavelength of light incident on the photonic crystal.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

Now, preferred embodiments of the present invention will be described in detail with reference to the annexed drawings.

Figure 1:
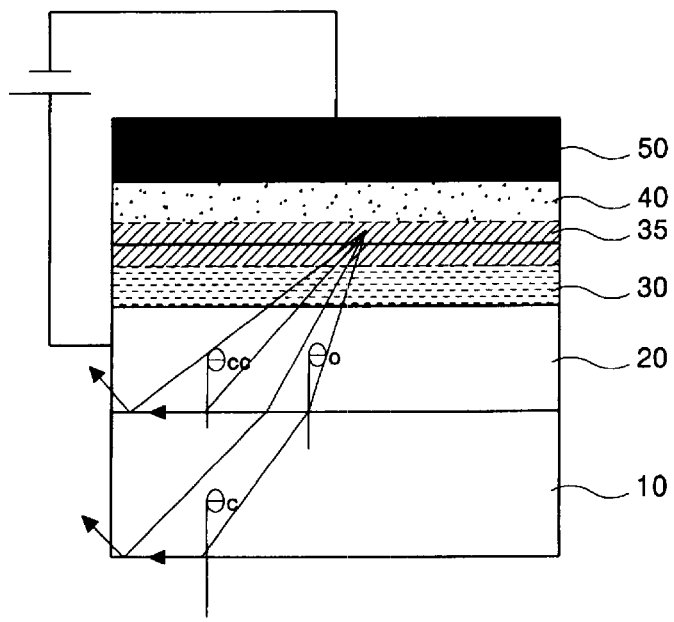
FIG. 1 is a schematic view of a conventional organic light emitting device.

FIGS. 2 through 6 are views showing organic light emitting devices according to the present invention. Herein, the same reference numerals as those in FIG. 1 designate components performing the same functions.

Figure 2:
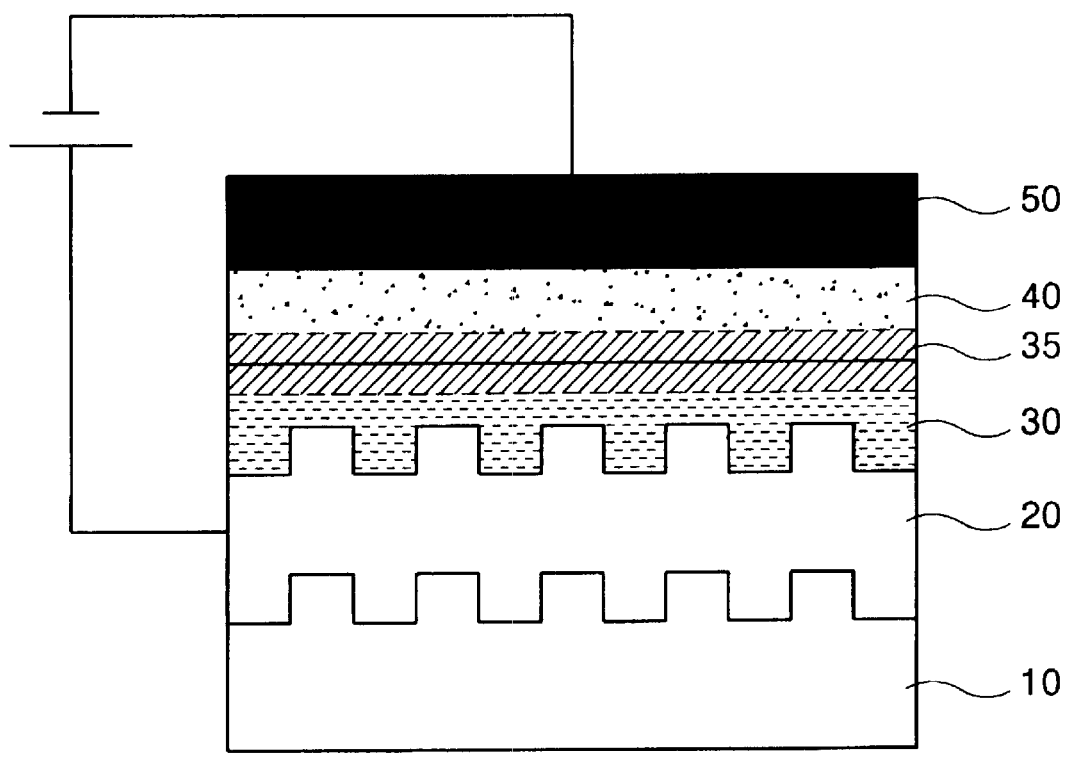
FIGS. 2 through 6 are views showing the organic light emitting devices according to the present invention.

FIG. 2 is a schematic view of an organic light emitting device according to the present invention. Reference to FIG. 2, the organic light emitting device has a structure in which a transparent electrode layer 20, a hole conduction layer 30, an electron conduction layer 40 and a cathode layer 50 are sequentially stacked on a transparent substrate 10, like in the conventional light emitting device However, there is a remarkable difference from the conventional light emitting device in that photonic crystal is formed in an upper surface of the transparent substrate 10, which is contacted with the transparent electrode layer 20, by a concavo-convex structure. The photonic crystal structure is formed in the upper surface of the transparent substrate 10 to a desired depth. Since the etching technology has been developed for a long time for semiconductor device fabricating process, the etching process can be precisely performed. Of course, it is also possible to form a protrusion on the upper surface of the transparent substrate 10.

After the concavo-convex structure is formed in the upper surface of the transparent substrate 10, the concavo-convex structure having the same shape is also formed in an upper surface of the transparent electrode layer 20. Of course, if the transparent electrode layer 20 is formed to be thick the concavo-convex structure formed in the transparent electrode layer 20 may be flattened. Even in this case, the effect of the present invention is still effective.

Figure 3:
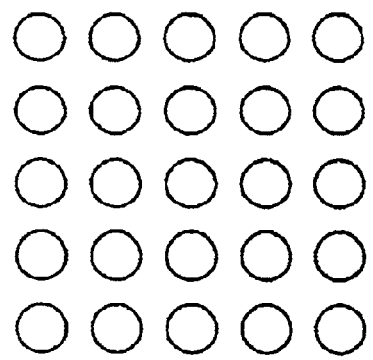
Figure 3:
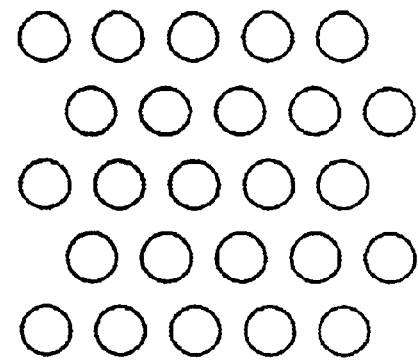
Figure 3:
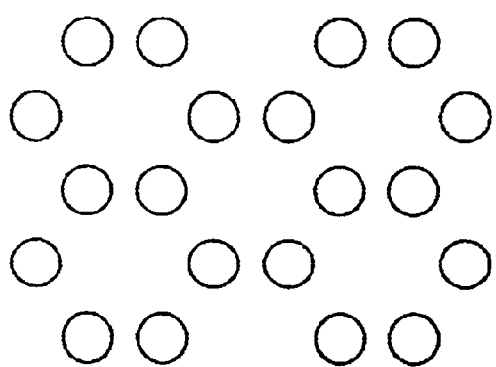
Figure 3:
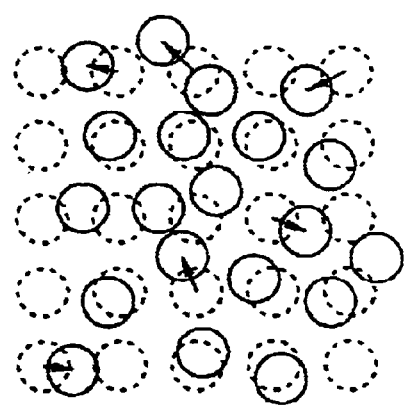

FIG. 3 shows various forms of the photonic crystal structure to be formed in the upper surface of the transparent substrate 10. As shown in FIGS. 3a to 3d, the photonic crystal may be formed in a square lattice type, a triangular lattice type, a honeycomb lattice type or a random lattice pattern.

In the random lattice pattern, the concavo-convex locations are deviated randomly up to ½ lattice constant from a nature position, as shown in FIG. 3d. Where the nature position, depicted with dashed circle, means the original concavo-convex location periodically and repeatedly arrayed in a triangular, rectangular or honeycomb lattice type prior to the deviating randomly.

Preferably, a period of the photonic crystal formed in the transparent substrate 10 is a third times to two times as large as a wavelength of light in the transparent electrode 20, and a depth of a concave portion is 10–200 nm. It is preferable that the depth of the concave portion is formed as deep as possible within an extent that the electrical properties of the transparent electrode layer are acceptable.

Figure 4:
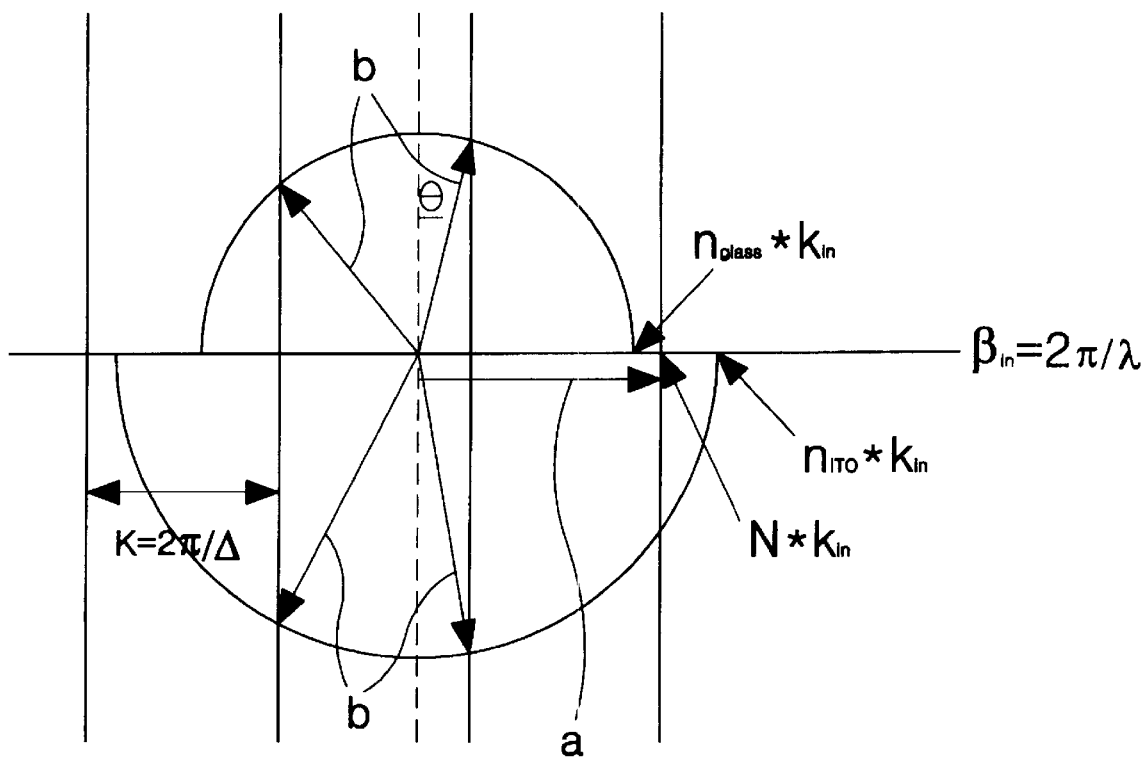

FIG. 4 shows a one-dimensional grating-shaped model to explain an effect of the present invention. In FIG. 4, a reference symbol $k_{in}$ designates a wave vector in a plane direction, a reference symbol N is an effective refractive index at the photonic crystal (herein, n(glass)<N<n(ITO), $\beta_{in}$ is $2\pi/\lambda$ (herein, λ is a wavelength of incident light), and K is $2\pi/\Delta$ (herein, Δ is a period of the photonic crystal).

The light designated by the reference symbol a is the light which is locked in the concave portion not to be radiated into the air. The light designated by the reference symbol b is leaky wave radiated to the outside. The leakage light is radiated in θ direction to satisfy the following equation: n(glass or ITO)·sin θ=N·$k_{in}$+q·K, wherein q is an integral number.

Since the direction of the leakage wave can be controlled according to the period of the photonic crystal, the period may be different according to a function of the light emitting device. In order to maximize the efficiency of light and an object of the displaying device, it is preferable to have the major direction of the leaky wave.

Typically, since an ITO film as the transparent electrode layer 20 is formed in thickness 30–200 nm, it is impossible to distinguish a position of an image formed by the light transmitted at an angle which is less than the critical angle from a position of an image formed by the leaky wave with the naked eye. Therefore, the image quality is not degraded by the leakage wave in the displaying device.

As shown in FIG. 3, if the photonic crystal is formed as a two-dimensional structure, the leaky wave is also diffracted and scattered in various directions. Thus, the light extraction efficiency should increase.

Figure 5:
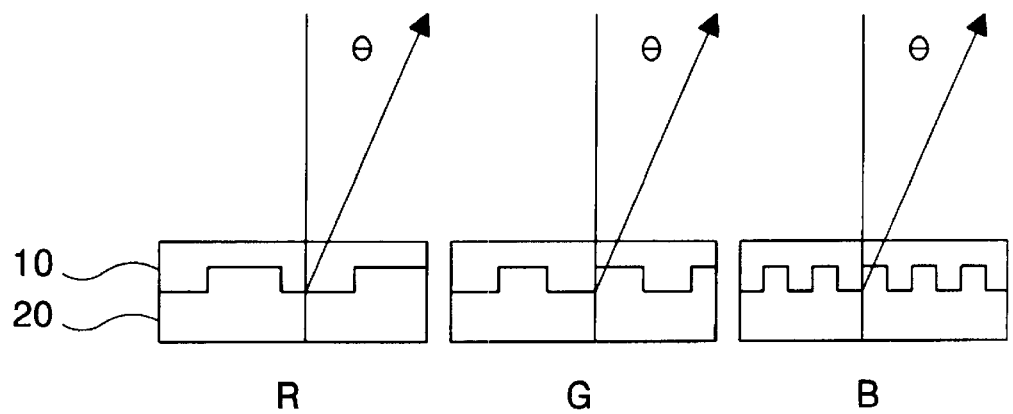
Figure 6:
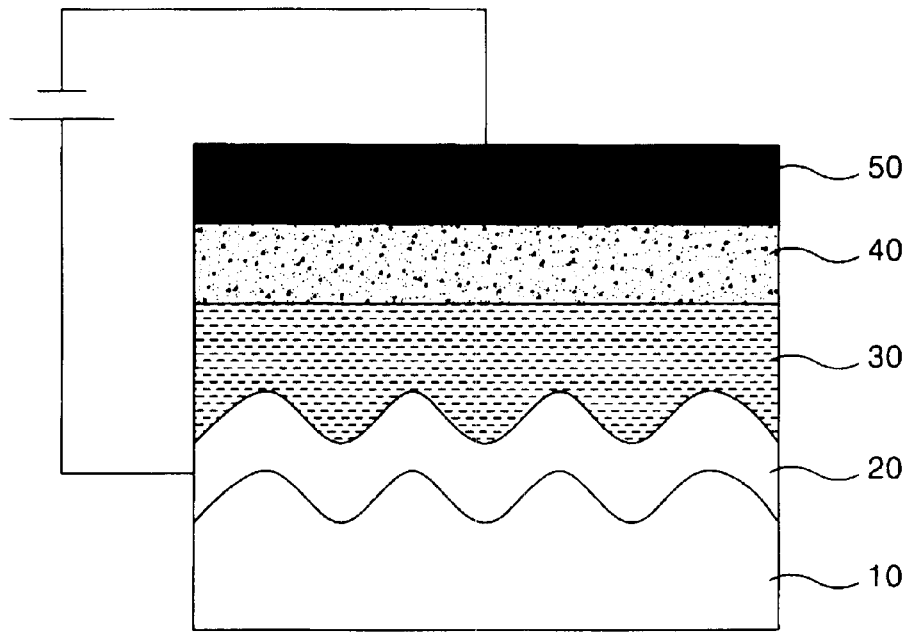
Figure 6:
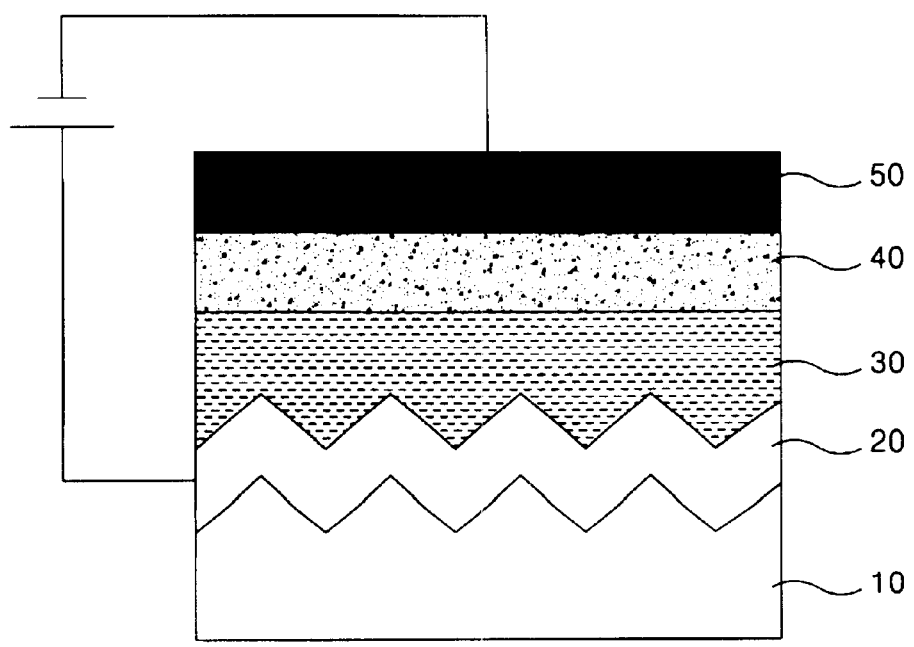

FIG. 5 shows an embodiment in which the light emitting device is applied to a color displaying device. In the color display device, if the photonic crystal is formed in the two-dimensional periodic array method, a diffraction angle toward the outside varies depending on the wavelength of the light generated from the active area 35. Therefore, in order to obtain the constant diffraction angle regardless of the wavelength of the light generated from the active area 35, the photonic crystal period Δ in each color pixel needs to satisfy the following equation: $\sin \theta = \lambda_{red}/\Delta = \lambda_{green}/\Delta = \lambda_{blue}/\Delta$.

The photonic crystal lattice can also be randomly arrayed with a desired mean period as shown in FIG. 3d, the color deflection phenomenon in which the light having a specific wavelength is deflected to a specific direction can be removed.

FIGS. 6a and 6b show various concavo-convex structures formed in the upper surface of the transparent substrate 10. As shown in drawings, the concavo-convex structure may have a curved shape (FIG. 6a) or a saw-toothed shape (FIG. 6b) instead of the vertical groove shape. The light extraction efficiency can be increased by the properly modulated structure.

Figure 7:
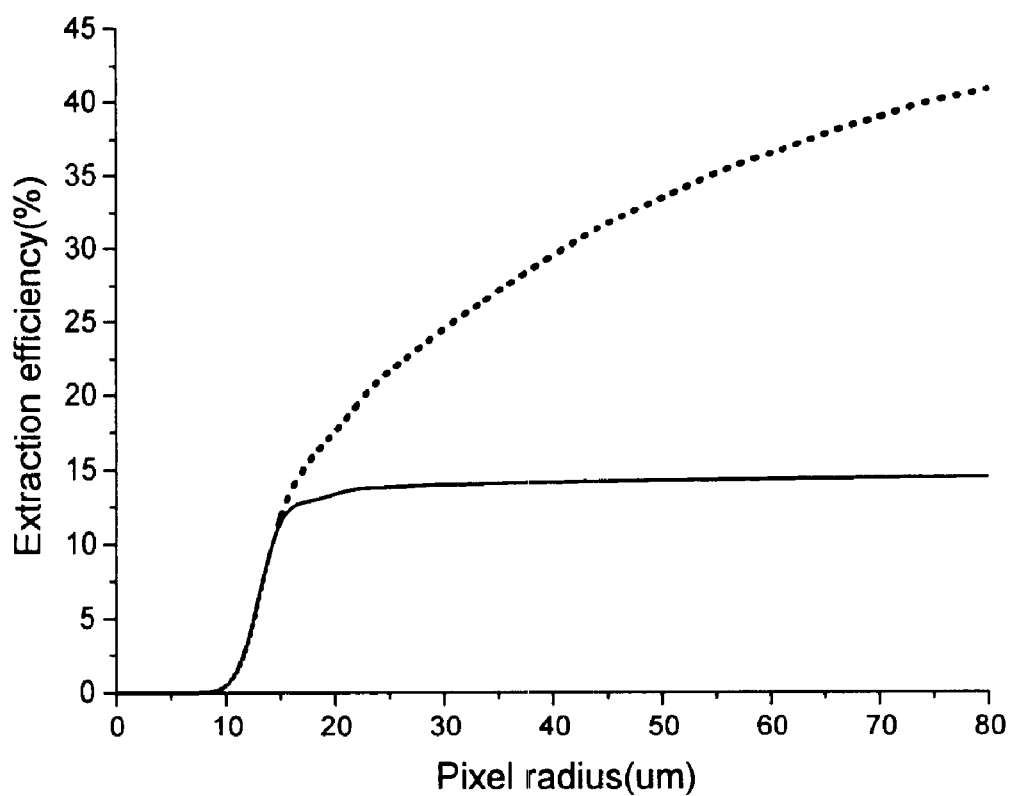
FIG. 7 illustrates a simulation example for the square lattice pattern which has the total 300 nm EL layer, 200 nm ITO layer, 70 nm pattern depth and wavelength 520 nm, lattice constant 400 nm.

FIG. 7 illustrates a simulation example for the square lattice pattern which has the total 300 nm EL layer, 200 nm ITO layer, 70 nm pattern depth and wavelength 520 nm, lattice constant 400 nm. In the FIG. 7, the solid line and dotted line represent unpatterned and patterned cases, respectively. It demonstrates that the extraction efficiency of the patterned case can be over two times larger than that of the conventional unpatterned case.

According to the present invention, as described above, the photonic crystal concavo-convex structure is formed in the transparent substrate to generate the leaky wave, thereby increasing the light extraction efficiency and the viewing angle without degeneration of the image quality. Further, since the effective refractive angle of the photonic crystal is ranged between the effective refractive angle of the transparent substrate 10 and the effective refractive angle of the transparent electrode layer 20, the photonic crystal provides the same effect as in nonreflective coating, thereby simultaneously increasing the transmittance.

While the present invention has been described in detail, it should be understood that various changes, substitutions and alterations could be made hereto without departing from the spirit and scope of the invention as defined by the appended claims.

What is claimed is:

1. An organic light emitting device, comprising:
   a transparent substrate having a concavo-convex structure in an upper surface thereof;
   a transparent electrode layer formed on the transparent substrate;
   a hole conduction layer comprised of an organic EL material and formed on the transparent electrode layer;
   an electron conduction layer comprised of an organic EL material and formed on the hole conduction layer;
   a cathode layer formed on the electron conduction layer;
   wherein an average spacing due to the concavo-convex structure formed in the upper surface of the transparent substrate is periodically and repeatedly arrayed in a honeycomb lattice type.

2. The device of claim 1, wherein an average spacing due to the concavo-convex structure formed in the upper surface of the transparent substrate is one-third times to two times as large as a wavelength of light generated at an interface between the electron conduction layer and the hole conduction layer.

3. The device of claim 1, wherein a concave portion of the concavo-convex structure formed in the upper surface of the transparent substrate has a depth of 10–200 nm.

4. The device of claim 1, wherein the area ratio of concave and convex of the concavo-convex structure formed in the upper surface of the transparent substrate has 20% to 80%.

5. The device of claim 1, wherein the concavo-convex shape is triangle, rectangle, or circle.

6. An organic light emitting device, comprising:
   a transparent substrate having a concavo-convex structure in an upper surface thereof;
   a transparent electrode layer formed on the transparent substrate;
   a hole conduction layer comprised of an organic EL material and formed on the transparent electrode layer;
   an electron conduction layer comprised of an organic EL material and formed on the hole conduction layer;
   a cathode layer formed on the electron conduction layer;
   wherein the concavo-convex locations are deviated randomly up to ½ lattice constant from the nature position of the concavo-convex periodically and repeatedly arrayed in a square lattice type.

7. An organic light emitting device, comprising:
   a transparent substrate having a concavo-convex structure in an upper surface thereof;
   a transparent electrode layer formed on the transparent substrate;
   a hole conduction layer comprised of an organic EL material and formed on the transparent electrode layer;
   an electron conduction layer comprised of an organic EL material and formed on the hole conduction layer;
   a cathode layer formed on the electron conduction layer;
   wherein the concavo-convex locations are deviated randomly up to ½ lattice constant from the nature position of the concavo-convex periodically and repeatedly arrayed in a triangular lattice type.

8. An organic light emitting device, comprising:
   a transparent substrate having a concavo-convex structure in an upper surface thereof;
   a transparent electrode layer formed on the transparent substrate;
   a hole conduction layer comprised of an organic EL material and formed on the transparent electrode layer;
   an electron conduction layer comprised of an organic EL material and formed on the hole conduction layer;
   a cathode layer formed on the electron conduction layer;
   wherein the concavo-convex locations are deviated randomly up to ½ lattice constant from the nature position of the concavo-convex periodically and repeatedly arrayed in a honeycomb lattice type.

9. The device of claim 1, 6, 7, or 8, wherein the concavo-convex structure formed in the upper surface of the transparent substrate is formed by etching the upper surface of the transparent substrate.

10. The device of claim 1, 6, 7, or 8, wherein the transparent electrode layer has the same concavo-convex structure as that formed in the upper surface of the transparent substrate.

11. The device of claim 1, 6, 7, or 8, wherein $\lambda/\Delta$ has a constant value, wherein Δ is a period of the photonic period due to the concavo-convex structure formed in the transparent substrate, and λ is a wavelength of the light incident to the photonic crystal.

12. An organic light emitting device, comprising:

a transparent substrate having a concavo-convex structure in an upper surface thereof;

a transparent electrode layer formed on the transparent substrate;

a hole conduction layer comprised of an organic EL material and formed on the transparent electrode layer;

an electron conduction layer comprised of an organic EL material and formed on the hole conduction layer;

a cathode layer formed on the electron conduction layer;

wherein the concavo-convex structure formed in the upper surface of the transparent substrate has a sinusoidal wave shape.

* * * * *

UNITED STATES PATENT AND TRADEMARK OFFICE
CERTIFICATE OF CORRECTION

PATENT NO. : 6,630,684 B2
DATED : October 7, 2003
INVENTOR(S) : Yong-Hee Lee et al.

It is certified that error appears in the above-identified patent and that said Letters Patent is hereby corrected as shown below:

<u>Title page,</u>
Item [73], Assignee, should be corrected to read -- Korea Advanced Institute of Science and Technology --.

Signed and Sealed this

Thirteenth Day of April, 2004

JON W. DUDAS
*Acting Director of the United States Patent and Trademark Office*